US012023929B2

(12) United States Patent
Koike et al.

(10) Patent No.: US 12,023,929 B2
(45) Date of Patent: *Jul. 2, 2024

(54) LIQUID EJECTING HEAD, LIQUID EJECTING APPARATUS, AND ACTUATOR

(71) Applicant: SEIKO EPSON CORPORATION, Tokyo (JP)

(72) Inventors: Harunobu Koike, Matsumoto (JP); Tatsuo Sawasaki, Fujimi-machi (JP); Masao Nakayama, Shiojiri (JP); Chihiro Nishi, Chino (JP); Toshihiro Shimizu, Fujimi-machi (JP); Yasushi Yamazaki, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/342,240

(22) Filed: Jun. 27, 2023

(65) Prior Publication Data

US 2023/0339229 A1    Oct. 26, 2023

Related U.S. Application Data

(62) Division of application No. 17/448,913, filed on Sep. 27, 2021, now Pat. No. 11,766,864.

(30) Foreign Application Priority Data

Sep. 29, 2020   (JP) .................................. 2020-163341

(51) Int. Cl.
*B41J 2/14*    (2006.01)

(52) U.S. Cl.
CPC ....... *B41J 2/14233* (2013.01); *B41J 2/14201* (2013.01); *B41J 2002/14258* (2013.01); *B41J 2202/03* (2013.01)

(58) Field of Classification Search
CPC ................ B41J 2/14233; B41J 2/14201; B41J 2002/14258; B41J 2202/03; B41J 2002/14419; B41J 2202/12; H01L 41/081; H01L 41/0973

See application file for complete search history.

(56) References Cited

U.S. PATENT DOCUMENTS 9,272,515 B2     3/2016  Ohashi et al.
11,766,864 B2 *  9/2023  Koike .................. B41J 2/14233
                                                            347/68

FOREIGN PATENT DOCUMENTS

JP         2008-078407 A       4/2008

* cited by examiner

*Primary Examiner* — Geoffrey S Mruk
(74) *Attorney, Agent, or Firm* — WORKMAN NYDEGGER (57) ABSTRACT

A liquid ejecting head includes a piezoelectric element and a vibrating plate configured to vibrate in response to actuation of the piezoelectric element, the vibrating plate including a first layer that contains $SiO_2$ and a second layer that contains $ZrO_2$ and that is stacked on the first layer. The second layer contains a first impurity element different from Zr, and the concentration of the first impurity element at an interface in contact with the first layer in the second layer is higher than the concentration of the first impurity element in an internal region that is included in the second layer and that is contiguous from the interface to the surface of the second layer.

13 Claims, 7 Drawing Sheets

LIQUID EJECTING HEAD, LIQUID EJECTING APPARATUS, AND ACTUATOR

This application is a divisional application of U.S. Pat. No. 11,766,864, issued Sep. 26, 2023, which is based on, and claims priority from JP Application Serial Number 2020-163341, filed Sep. 29, 2020, the disclosures of which are hereby incorporated by reference herein in their entirety.

BACKGROUND

1. Technical Field

The present disclosure relates to a liquid ejecting head, a liquid ejecting apparatus, and an actuator.

2. Related Art

A liquid ejecting head provided with a vibrating plate including an insulating film composed of $ZrO_2$ and an elastic film composed of $SiO_2$ and provided with a piezoelectric element that displaces the vibrating plate is known (for example, JP-A-2008-78407).

The insulating film may have residual stress such as tensile stress. Consequently, when an external force is applied to the vibrating plate in response to actuation of the piezoelectric element, the vibrating plate may crack.

SUMMARY

According to a first aspect of the present disclosure, a liquid ejecting head is provided. The liquid ejecting head includes a piezoelectric element and a vibrating plate configured to vibrate in response to actuation of the piezoelectric element, the vibrating plate including a first layer that contains $SiO_2$ and a second layer that contains $ZrO_2$ and that is stacked on the first layer. The second layer contains a first impurity element different from Zr and the concentration of the first impurity element at an interface in contact with the first layer in the second layer may be higher than the concentration of the first impurity element in an internal region that is included in the second layer and that is contiguous from the interface to the surface of the second layer.

According to a second aspect of the present disclosure, a liquid ejecting apparatus is provided. The liquid ejecting apparatus includes the liquid ejecting head according to the first aspect and a control portion that controls an ejection operation of the liquid ejecting head.

According to a third aspect of the present disclosure, an actuator is provided. The actuator includes a piezoelectric element and a vibrating plate configured to vibrate in response to actuation of the piezoelectric element, the vibrating plate including a first layer that contains $SiO_2$ and a second layer that contains $ZrO_2$ and that is stacked on the first layer. The second layer contains a first impurity element different from Zr and the concentration of the first impurity element at an interface in contact with the first layer in the second layer may be higher than the concentration of the first impurity element in an internal region that is included in the second layer and that is contiguous from the interface to the surface of the second layer.

DESCRIPTION OF EXEMPLARY EMBODIMENTS

A. First Embodiment

Figure 1:
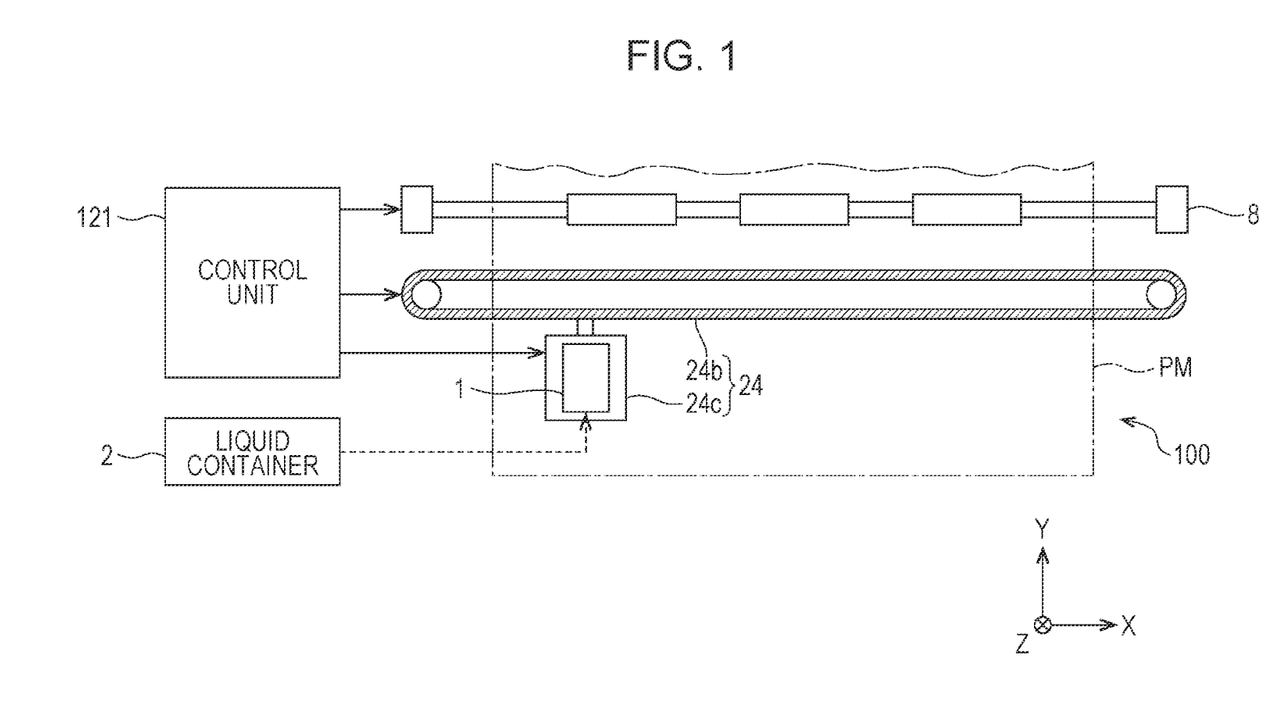
FIG. 1 is an explanatory diagram illustrating a liquid ejecting apparatus according to the present embodiment.

FIG. 1 is an explanatory diagram illustrating a liquid ejecting apparatus 100 equipped with a liquid ejecting head 1 according to the present embodiment. The liquid ejecting apparatus 100 is a printing apparatus of an ink jet system that ejects a liquid ink. The liquid ejecting apparatus 100 includes a liquid container 2 configured to store the ink, and an image is formed on a medium PM by using the ink in the liquid container 2. FIG. 1 schematically illustrates the X-direction, the Y-direction, and the Z-direction orthogonal to each other. Each direction illustrated in FIG. 1 is common to FIG. 1 and subsequent drawings.

The liquid ejecting apparatus 100 includes the liquid ejecting head 1, a movement mechanism 24, a transport mechanism 8, and a control unit 121. The liquid ejecting head 1 is an ink jet-type recoding head configured to eject an ink supplied from the liquid container 2. The movement mechanism 24 includes a ring-like belt 24b and a carriage 24c configured to hold the liquid ejecting head 1. The carriage 24c is fixed to the belt 24b. The movement mechanism 24 reciprocates the liquid ejecting head 1 together with the carriage 24c in a movement direction by rotating the belt 24b in both forward and reverse directions. The transport mechanism 8 transports the medium PM in a direction intersecting the movement direction of the liquid ejecting head 1.

The control unit 121 functions as a control portion that forms an image on the medium PM by operating the transport mechanism 8, the movement mechanism 24, and the liquid ejecting head 1 in accordance with each other. More specifically, the control unit 121 forms an image on the medium PM by repeatedly controlling ink ejection from the liquid ejecting head 1 and reciprocating the liquid ejecting head 1 based on control of the operation of the movement mechanism 24, while the medium PM is transported by controlling the operation of the transport mechanism 8.

Figure 2:
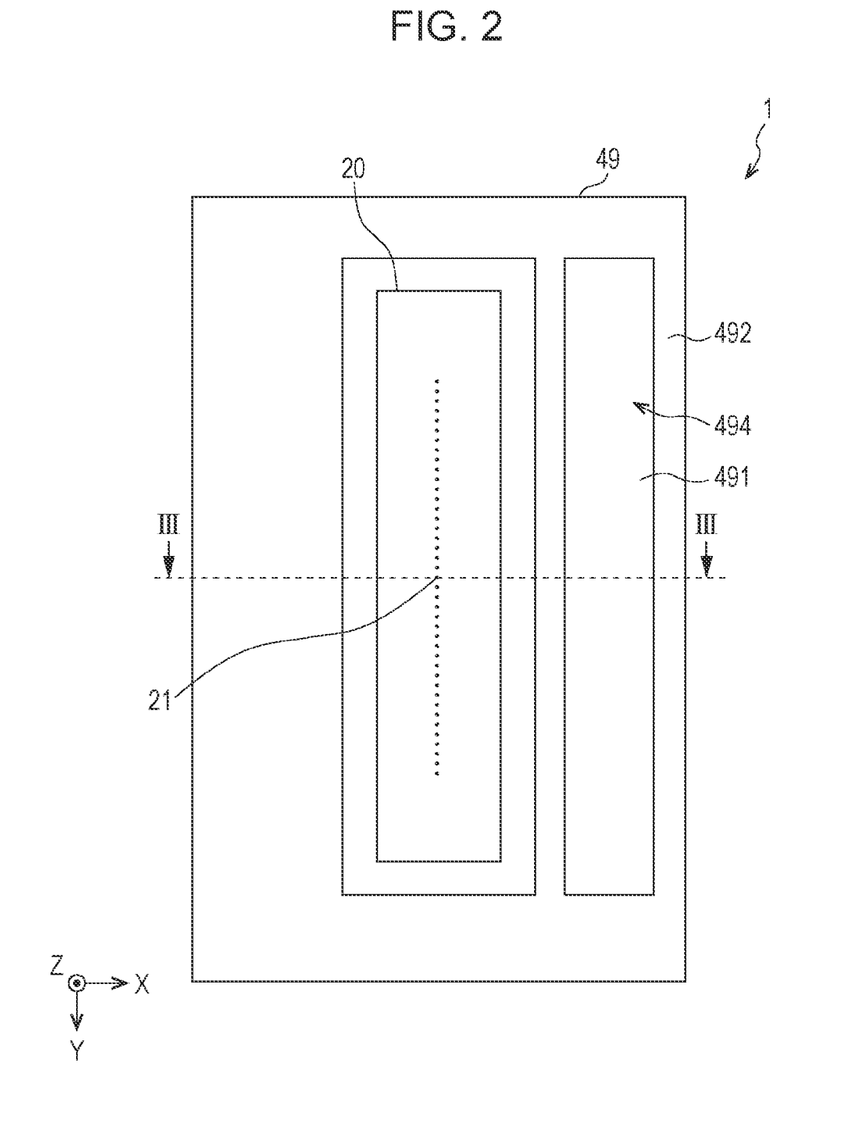
FIG. 2 is a plan view of a liquid ejecting head.

FIG. 2 is a plan view of the liquid ejecting head 1. Regarding the liquid ejecting head 1 in FIG. 2, the surface facing the medium PM is provided with a nozzle plate 20. A plurality of nozzles 21 are arranged in one direction in the nozzle plate 20.

Figure 3:
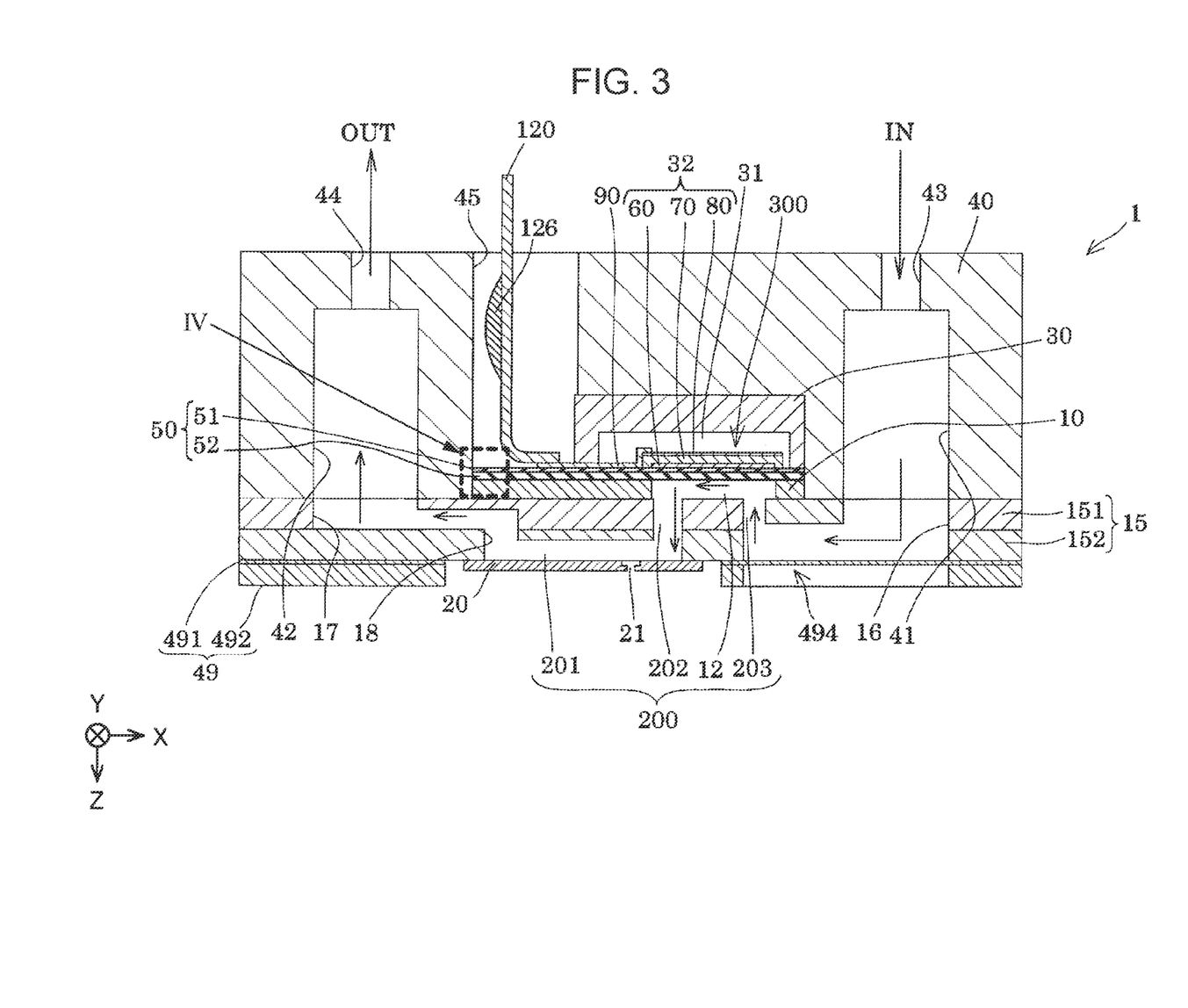
FIG. 3 is a sectional view cut along line III-III in FIG. 2.

FIG. 3 is a sectional view cut along line III-III in FIG. 2. The liquid ejecting head 1 includes a flow-passage-forming substrate 10, a communication plate 15, the nozzle plate 20, a compliance substrate 49, a vibrating plate 50, an actuator 300, a protective substrate 30, and a case member 40. Regarding the example in FIG. 3, the ink ejection direction of the nozzle 21 is in accord with the Z-direction. For the sake of facilitating understanding of the technology, in the following explanations, the ink ejection direction with respect to a reference position is also referred to as "down", and the direction opposite to the ink ejection direction with respect to the reference position is also referred to as "up".

The flow-passage-forming substrate 10 is a flat-plate-like member. The flow-passage-forming substrate 10 includes a pressure chamber 12. The communication plate 15 is arranged on the lower-surface side of the flow-passage-forming substrate 10. The communication plate 15 is formed by stacking a first communication plate 151 and a second communication plate 152, which have ink flow passages. The ink flow passages of the communication plate 15 include a first communication portion 16, a second communication portion 17, a third communication portion 18, a first flow passage 201, a second flow passage 202, and a supply passage 203. The first flow passage 201, the second flow passage 202, the supply passage 203, and the pressure chamber 12 are in communication with each other and constitute the ink flow passages. The number of the first flow passages 201, the second flow passages 202, the supply passages 203, and the pressure chambers 12 formed and arranged in the arrangement direction of the nozzles 21 corresponds to the number of the nozzles 21. The first flow passage 201, the second flow passage 202, the supply passage 203, and the pressure chamber 12 collectively constitute an individual flow passage 200. One each of the first communication portion 16, the second communication portion 17, and the third communication portion 18 is formed and functions as an ink flow passage common to a plurality of individual flow passages 200.

The nozzle plate 20 is arranged on the lower-surface side of the communication plate 15. The nozzle plate 20 blocks part of the opening on the lower-surface side of the communication plate 15 and functions as the inner wall of the first flow passage 201, the second flow passage 202, and the third communication portion 18, which serve as the ink flow passages. The nozzle 21 is formed at the position that blocks the first flow passage 201 of the nozzle plate 20.

The compliance substrate 49 is arranged on the lower-surface side of the communication plate 15 so as to surround the nozzle plate 20. The compliance substrate 49 blocks part of the opening on the lower-surface side of the communication plate 15 and functions as part of the inner wall of the first communication portion 16 serving as the ink flow passage. The compliance substrate 49 includes a sealing film 491 and a fixed substrate 492. The fixed substrate 492 is arranged on the lower-surface side of the sealing film 491. The fixed substrate 492 includes a compliance portion 494 in a region sealing the first communication portion 16. The compliance portion 494 is an opening which is formed in the fixed substrate 492 and at which the sealing film 491 is exposed. The compliance portion 494 is arranged in a region sealing the first communication portion 16 of the communication plate 15. Consequently, the sealing film 491 can be elastically deformed inward of the opening of the fixed substrate 492 so as to smooth fluctuations of the pressure in the first communication portion 16.

The protective substrate 30 is a substrate for housing the actuator 300. A recessed actuator-holding portion 31 is included in the protective substrate 30. A space for housing a plurality of deformable actuators 300 is delimited by the actuator-holding portion 31.

The case member 40 is a member for covering the upper surfaces of the flow-passage-forming substrate 10, the communication plate 15, and the protective substrate 30. The case member 40 has a coupling hole 45 and ink flow passages. The coupling hole 45 is a through hole that vertically passes through the case member 40. A flexible cable 120 provided with a driving circuit 126 is arranged in the coupling hole 45. The driving circuit 126 is a semiconductor element for supplying a driving signal for actuating a piezoelectric element 32. The flexible cable 120 is electrically coupled to a lead electrode 90 in the coupling hole 45.

The ink flow passages of the case member 40 include a first liquid chamber portion 41, a second liquid chamber portion 42, an inlet 43, and an outlet 44. The inlet 43 and the outlet 44 are coupled to an ink storage chamber (not illustrated in the drawing). The first liquid chamber portion 41 is in communication with the first communication portion 16 of the communication plate 15, and the second liquid chamber portion 42 is in communication with the second communication portion 17 of the communication plate 15.

In FIG. 3, the flow direction of the ink is schematically illustrated by using arrows. The ink supplied from an ink storage portion is introduced into the first liquid chamber portion 41 in the case member 40 through the inlet 43. The flow of the ink supplied to the first liquid chamber portion 41 that flows to the first communication portion 16 of the communication plate 15 and branches into each of the plurality of individual flow passages 200. Each of the branched ink flows through the supply passage 203, the pressure chamber 12, the second flow passage 202, and the first flow passage 201 in this order and merges when reaching the third communication portion 18. The ink supplied to the third communication portion 18 flows through the second communication portion 17 to the second liquid chamber portion 42 and is discharged through the outlet 44 to the ink storage portion. The ink discharged to the ink storage portion is circulated and reintroduced through the inlet 43.

The actuator 300 is arranged at the upper surface of the flow-passage-forming substrate 10. The actuator 300 converts an input electrical signal to physical movement and transfers this movement to the ink in the pressure chamber 12. The actuator 300 includes the piezoelectric element 32 and the vibrating plate 50. The piezoelectric element 32 includes a first electrode 60, a piezoelectric layer 70, and a second electrode 80.

The piezoelectric layer 70 is arranged between the first electrode 60 and the second electrode 80. The piezoelectric layer 70 is a layer composed of, for example, lead zirconate titanate (PZT) and deforms in response to application of a voltage. The piezoelectric layer 70 is not limited to PZT, and other ferroelectric piezoelectric materials, relaxor ferroelectric materials in which a metal such as niobium, nickel, magnesium, bismuth, or yttrium is added to the ferroelectric piezoelectric material, and the like may be used.

The first electrode 60 disposed below the piezoelectric layer 70 is a common electrode of the piezoelectric element 32, and the second electrode 80 disposed above the piezoelectric layer 70 is an individual electrode of the piezoelectric element 32. The lead electrode 90 is coupled to the second electrode 80. A driving signal output from the driving circuit 126 is supplied to the second electrode 80 via the flexible cable 120 and the lead electrode 90. A voltage is applied to the piezoelectric layer 70 by the first electrode 60 and the second electrode 80 to deform the piezoelectric layer 70. In this regard, the first electrode 60 disposed below the piezoelectric layer 70 may be set to be an individual electrode, and the second electrode 80 disposed above the piezoelectric layer 70 may be set to be a common electrode.

The vibrating plate 50 is arranged at the upper surface of the flow-passage-forming substrate 10 while being in contact with the actuator 300. The vibrating plate 50 is vibrated in response to actuation of the piezoelectric element 32, that is, deformation of the piezoelectric layer 70, so as to apply pressure to the ink in the pressure chamber 12. The ink is ejected from the nozzle 21 by the pressure fluctuations of the ink in the pressure chamber 12 being transferred to the ink in the second flow passage 202 and the first flow passage 201.

The vibrating plate 50 includes the insulator film 51 and the elastic film 52. The elastic film 52 is a layer containing silicon dioxide ($SiO_2$). The elastic film 52 is also referred to as a "first layer 52". The thickness of the elastic film 52 may be set to be 0.1 μm or more and 0.5 μm or less. The elastic film 52 is arranged at the flow-passage-forming substrate 10 and blocks the opening on the upper-surface side of the flow-passage-forming substrate 10. The insulator film 51 containing zirconium oxide ($ZrO_2$) is stacked on the elastic film 52. The insulator film 51 is also referred to as a "second layer 51". The thickness of the insulator film 51 may be set to be 0.1 μm or more and 1.2 μm or less. In the present embodiment, the insulator film 51 contains $ZrO_2$ having a columnar crystal structure. In this regard, the insulator film 51 contains monoclinic $ZrO_2$. In the present embodiment, the elastic film 52 and the insulator film 51 contain, for example, a total amount of less than 10% by mass of impurity elements. The form of the impurity element contained in the insulator film 52 and the insulator film 51 may be in an atomic form, in an elemental form, or in a molecule such as an oxide.

Regarding the method for forming the vibrating plate 50, silicon wafer for forming the flow-passage-forming substrate 10 is subjected to thermal oxidation in a diffusion furnace at substantially 1,100 degrees Celsius so as to form a silicon dioxide film serving as the elastic film 52 on the surface. A zirconium (Zr) layer is formed on the resulting elastic film 52 by using, for example, a sputtering method, and performing thermal oxidation in a diffusion furnace at 500 degrees Celsius or higher and 1,200 degrees Celsius or lower so as to form the insulator film 51 containing zirconium oxide. Examples of the method for an impurity element to be contained in the insulator film 51 include a method in which, when the insulator film 51 is formed by using the sputtering method, the insulator film 51 is formed through sputtering by using a target already containing the impurity element. The concentration of the impurity element contained in the insulator film 51 can be controlled by increasing or decreasing the concentration of the impurity element in the sputtering target. Specifically, the concentration of the impurity element can be increased by increasing the concentration of the impurity element in the sputtering target.

Figure 4:
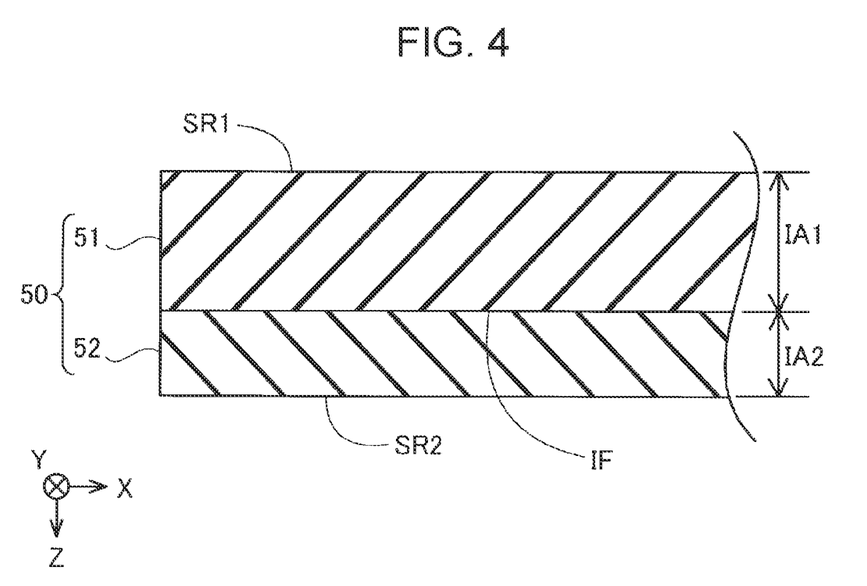
FIG. 4 is an enlarged explanatory diagram illustrating a vibrating plate.

FIG. 4 is an enlarged explanatory diagram illustrating region IV in FIG. 3. For the sake of facilitating understanding of the technology, members other than the vibrating plate 50 are omitted from FIG. 4. In FIG. 4, the interface IF of the insulator film 51, the surface SR1 of the insulator film 51, the internal region IA1 of the insulator film 51, the surface SR2 of the elastic film 52, and the internal region IA2 of the elastic film 52 are schematically illustrated. The interface IF denotes a region of the insulator film 51 in contact with the elastic film 52. In general, the interface of a multilayer body in which a plurality of layers are stacked may become a cracking start point and may become the reason for causing a deterioration in the strength of the multilayer body. The surface SR1 of the insulator film 51 is a surface included in a region opposite to the elastic film 52 with the interface region FA interposed therebetween and is a surface opposite to the interface IF of the insulator film 51. As illustrated in FIG. 3, the surface SR1 of the insulator film 51 is a surface in contact with the piezoelectric element 32. The internal region IA1 of the insulator film 51 is a region contiguous from the interface IF to the surface SR1 of the insulator film 51. The surface SR2 of the elastic film 52 is a surface opposite to the surface of the elastic film 52 in contact with the insulator film 51. The internal region IA2 of the elastic film 52 is a region from the surface SR2 of the elastic film 52 to the surface in contact with the insulator film 51. The interface IF is not limited to the region of the insulator film 51 in contact with the elastic film 52 and may include part of the internal region IA1 contiguous from the region of the insulator film 51 in contact with the elastic film 52.

Figure 5:
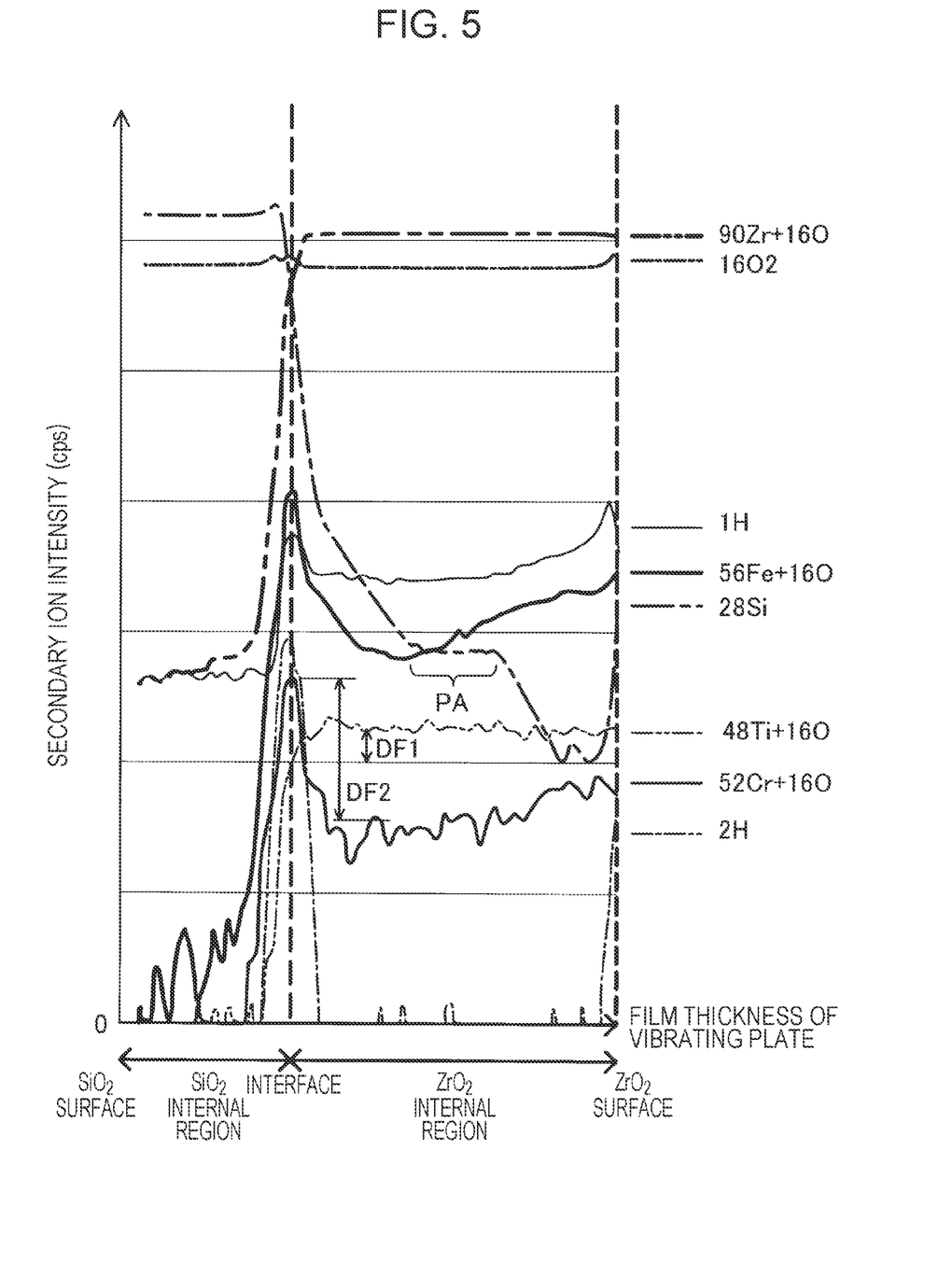
FIG. 5 is an explanatory diagram illustrating examples of concentration distributions of elements contained in an elastic film and an insulator film.

FIG. 5 is an explanatory diagram illustrating examples of concentration distributions of elements contained in the elastic film 52 and the insulator film 51. FIG. 5 illustrates the measurement results of the film thickness of the vibrating plate 50 versus the secondary ion intensity of each element and each molecule by using secondary ion mass spectrometry (SIMS), that is, the film thickness of the vibrating plate 50 versus the concentration distribution of each element and each molecule. The vertical axis of FIG. 5 represents the secondary ion intensity, and the horizontal axis represents the depth from the surface SR1 of the insulator film 51, that is, the film thickness of the vibrating plate 50. In FIG. 5, the position of the surface SR1 and the position of the interface IF of the elastic film 52 and the insulator film 51 are illustrated on the horizontal axis. For the sake of facilitating understanding of the technology, the position of the interface IF, the position of the surface SR2 of the elastic film 52 serving as a $SiO_2$ layer, and the position of the surface SR1 of the insulator film 51 serving as a $ZrO_2$ layer are schematically illustrated below the horizontal axis of FIG. 5.

Regarding the method for measuring the secondary ion intensity, a sample of the vibrating plate 50 cut to a size of 2 cm×2 cm is prepared. Regarding the method for forming the vibrating plate 50, as described above, a silicon dioxide film serving as the elastic film 52 is formed on the silicon wafer surface, a zirconium layer is formed on the resulting elastic film 52, and the insulator film 51 containing zirconium oxide is formed through thermal oxidation. The prepared sample of the vibrating plate 50 is exposed to a heavy-water atmosphere that is a relatively heavy-water-rich environment at a temperature of 45 degrees Celsius and a humidity of 95% for 24 hours and is thereafter recovered. The recovered sample of the vibrating plate 50 is placed into a secondary ion mass spectrometer and measured. Examples of the measurement target element include hydrogen, deuterium, oxygen, silicon, zirconium, titanium, aluminum, iron, and chromium.

In the present embodiment, the impurity elements contained in the elastic film 52 and the insulator film 51 include a first impurity element and a second impurity element. The impurity element of the elastic film 52 does not include Si, and the impurity element of the insulator film 51 does not include Zr. The first impurity element and the second impurity element differ from each other due to a difference in the trend of the concentration distribution in the insulator film 51.

The first impurity element denotes an impurity element, the concentration of which is higher at the interface IF than in the internal region IA1 of the insulator film 51. In the example illustrated in FIG. 5, chromium (Cr) and iron (Fe) correspond to the first impurity element. For example, Cr is present as chromium(II) oxide represented by a composition formula CrO, and Fe is present as iron(II) oxide represented by a composition formula FeO. Cr may be present as chromium(III) oxide represented by a composition formula $Cr_2O_3$, chromium(IV) oxide represented by a composition formula $CrO_2$, or chromium(VI) oxide represented by a composition formula $CrO_2$. It is conjectured that, when the insulator film 51 is formed by subjecting the Zr layer arranged on the elastic film 52 to thermal oxidation, the cause of the concentration of the first impurity element being higher at the interface IF than in the internal region IA1 is due to the first impurity element contained in the insulator film 51 moving toward the interface IF in accordance with the Zr layer being successively oxidized from the surface SR1 toward the interface IF. The first impurity element may be a metal element. In this regard, the internal region IA1 of the insulator film 51 is not limited to containing the first impurity element.

In the present embodiment, the first impurity elements of the insulator film 51 further include Si in addition to Cr and Fe. As illustrated in FIG. 5, regarding the Si concentration distribution, the Si concentration is higher at the interface IF than in the internal region IA1. As indicated by a region PA in FIG. 5, the Si concentration distribution has a planar region (equivalent to a plateau region) in which the concentration is constant in the internal region IA1 of the insulator film 51. In this regard, the Si concentration distribution in the internal region IA1 gradually increases with increasing proximity to the interface IF.

In the present embodiment, the first impurity element is not contained in the elastic film 52. However, the first impurity element may be contained in the elastic film 52. In such an instance, the concentration of the first impurity element in the elastic film 52 may be lower than the concentration of the first impurity element at the interface IF and may be lower than the concentration of the first impurity element in the internal region IA1 of the insulator film 51.

The second impurity element denotes an element, the concentration of which tends to be substantially constant in the insulator film 51. In the example illustrated in FIG. 5, Ti corresponds to the second impurity element. For example, Ti is present as titanium monoxide represented by a composition formula TiO. Ti may be present as titanium dioxide represented by a composition formula $TiO_2$ or titanium(III) oxide represented by a composition formula $Ti_2O_3$. It is conjectured that the cause of the concentration of the second impurity element being constant is due to the thermal oxidation of the second impurity element that has diffused into the Zr layer formed on the elastic film 52 through sputtering proceeding with Zr. The second impurity element may be a metal element and may be more favorably a metal element having a larger particle diameter than Zr.

In the insulator film 51, the difference DF1 between the concentration of the second impurity element at the interface IF and the concentration of the second impurity element in the internal region IA1 is smaller than the difference DF2 between the concentration of Cr serving as the first impurity element at the interface IF and the concentration of Cr in the internal region IA1. In other words, the second impurity element is an impurity element, the concentration of which is not higher at the interface IF than in the internal region IA1. The concentration of the first impurity element at the interface IF may be equal to the concentration of the first impurity element in the internal region IA1.

Figure 6:
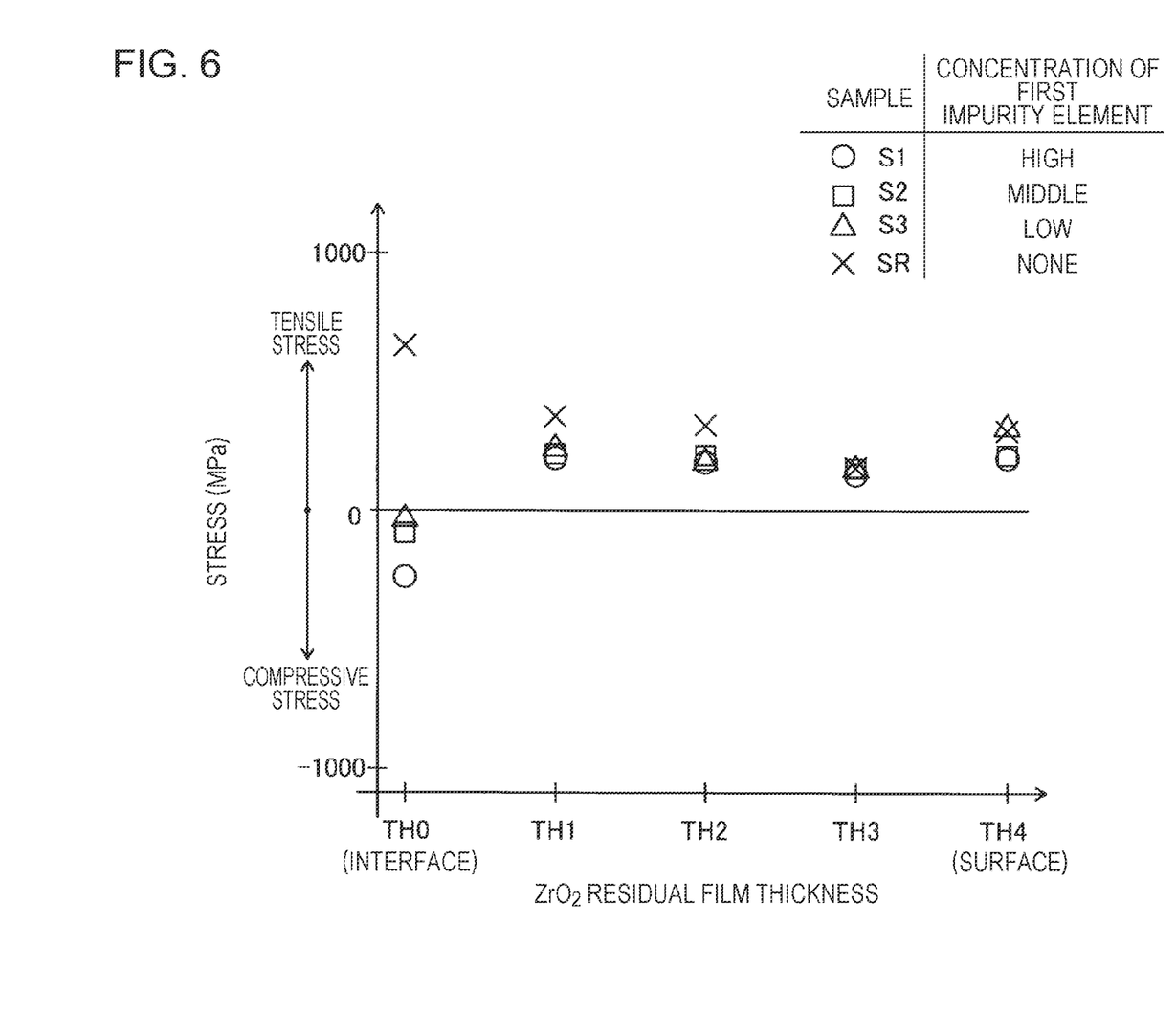
FIG. 6 is an explanatory diagram illustrating the film thickness of an insulator film versus the distribution of the residual stress.

FIG. 6 is an explanatory diagram illustrating the film thickness of the insulator film 51 versus the distribution of the residual stress. FIG. 6 illustrates the measurement results of the residual stress of four samples of the insulator film 51 that differ from each other in the concentration of the first impurity element. The horizontal axis of FIG. 6 represents the film thickness from the interface IF to the surface SR1 of the insulator film 51, and the vertical axis of FIG. 6 represents the residual stress of the insulator film 51. The residual stress was measured by using a thin film stress measuring apparatus. The residual stress was obtained by acquiring the curvature of a sample and performing conversion to stress. The residual stress of each sample of the insulator film 51 is the result of measurement performed after the residual film thickness TH4 at the surface SR1 of the insulator film 51 was set to each of the residual film thicknesses TH1, TH2, and TH3 as the internal region IA1 and up to the residual thickness TH0 at the interface IF through ion milling by using argon ions. The concentrations of the first impurity element in Samples S1 to S3 are less than 10% by mass and differ from each other. Specifically, the concentration of the first impurity element in Sample S1 is lowest, the concentration of the first impurity element in Sample S3 is highest, and the concentration of the first impurity element in Sample S2 is higher than the concentration in Sample S1 and lower than the concentration in Sample S3. As the comparative example, FIG. 6 illustrates the result of Sample SR not containing the first impurity element.

As illustrated by Sample SR in FIG. 6, when the insulator film 51 does not contain the first impurity element, the residual stress of each of the interface IF to the surface SR1 of the insulator film 51 is tensile stress. Regarding Samples S1 to S3 at the residual film thickness TH0, as illustrated in FIG. 6, the interfaces IF of the insulator films 51 have compressive stress. The compressive stress at the interface IF increases as the concentration of the first impurity element increases and is maximum in Sample S3 in which the concentration of the first impurity element is highest. Regarding Samples S1 to S3, the residual stress at locations other than the interface IF, that is, at each of the residual film thickness TH4 at the surface SR1 of the insulator film 51 and the residual film thicknesses TH1, TH2, and TH3 in the internal region IA1 is tensile stress. In Samples S1 to S3, the tensile stress at the surface SR1 is greater than the tensile stress in the internal region IA1.

As described above, according to the liquid ejecting head 1 of the present embodiment, the vibrating plate 50 includes the elastic film 52 containing $SiO_2$ and the insulator film 51 containing $ZrO_2$. The insulator film 51 contains the first impurity element, the concentration of the first impurity element at the interface IF of the insulator film 51 is higher than the concentration of the first impurity element in the internal region IA1. The strength of the vibrating plate 50 can be improved by providing residual compressive stress in the interface region FA, which tends to be a cracking start point.

According to the liquid ejecting head 1 of the present embodiment, the first impurity element contains a metal element. Therefore, the concentration of the first impurity element at the interface IF can be further increased, and the strength of the vibrating plate 50 can be further improved.

According to the liquid ejecting head 1 of the present embodiment, the first impurity element contains Fe. Therefore, the concentration of the first impurity element at the interface IF can be further increased, and the strength of the vibrating plate 50 can be further improved.

According to the liquid ejecting head 1 of the present embodiment, the first impurity element contains Cr. Therefore, the concentration of the first impurity element at the interface IF can be further increased, and the strength of the vibrating plate 50 can be further improved.

According to the liquid ejecting head 1 of the present embodiment, the first impurity element contains Si. Therefore, the adhesiveness between the insulator film 51 and the elastic film 52 can be improved, and the strength of the vibrating plate 50 can be improved.

According to the liquid ejecting head 1 of the present embodiment, the internal region IA1 of the insulator film 51 contains the first impurity element. Therefore, the vibrating plate 50 in which the internal region IA1 of the insulator film 51 contains the first impurity element can be obtained.

According to the liquid ejecting head 1 of the present embodiment, the internal region IA1 contains Si serving as the first impurity element. The Si concentration distribution in the internal region IA1 of the insulator film 51 has a planar region in which the concentration is constant. Therefore, the vibrating plate 50 in which the internal region IA1 has a planar region of the Si concentration can be obtained.

According to the liquid ejecting head 1 of the present embodiment, the insulator film 51 further contains the second impurity element, the concentration of which in the insulator film 51 is substantially constant. Therefore, the vibrating plate 50 containing the second impurity element, the concentration of which in the internal region IA1 of the insulator film 51 is substantially constant, can be obtained.

According to the liquid ejecting head 1 of the present embodiment, the second impurity element contains a metal element. Therefore, the vibrating plate 50 containing a metal element as the second impurity element, the concentration of which in the internal region IA1 of the insulator film 51 is substantially constant, can be obtained.

According to the liquid ejecting head 1 of the present embodiment, the second impurity element contains Ti. Therefore, the vibrating plate 50 containing Ti, the concentration of which in the internal region IA1 of the insulator film 51 is substantially constant, can be obtained.

According to the liquid ejecting head 1 of the present embodiment, the concentration of the first impurity element in the elastic film 52 is lower than the concentration of the first impurity element at the interface IF and is lower than the concentration of the first impurity element in the internal region IA1 of the insulator film 51. The concentration of the first impurity element in the elastic film 52 can be reduced, and the productivity of the elastic film 52 can be improved.

According to the liquid ejecting head 1 of the present embodiment, the insulator film 51 contains $ZrO_2$ having a columnar crystal structure. Therefore, the adhesiveness between the insulator film 51 and the elastic film 52 can be improved, and peeling and the like of the vibrating plate 50 can be suppressed or prevented from occurring.

According to the liquid ejecting head 1 of the present embodiment, monoclinic $ZrO_2$ is contained. Therefore, the adhesiveness between the insulator film 51 and the elastic film 52 can be improved, and peeling and the like of the vibrating plate 50 can be suppressed or prevented from occurring.

According to the liquid ejecting head 1 of the present embodiment, the interface IF of the insulator film 51 has compressive stress. Therefore, the strength of the vibrating plate 50 can be improved by providing residual compressive stress in the interface region FA, which tends to be a cracking start point. In addition, the internal region IA1 having the tensile stress as the residual stress enables the residual stress balance of the overall insulator film 51 to be appropriate and enables the vibrating plate 50 having higher strength to be obtained.

Figure 7:
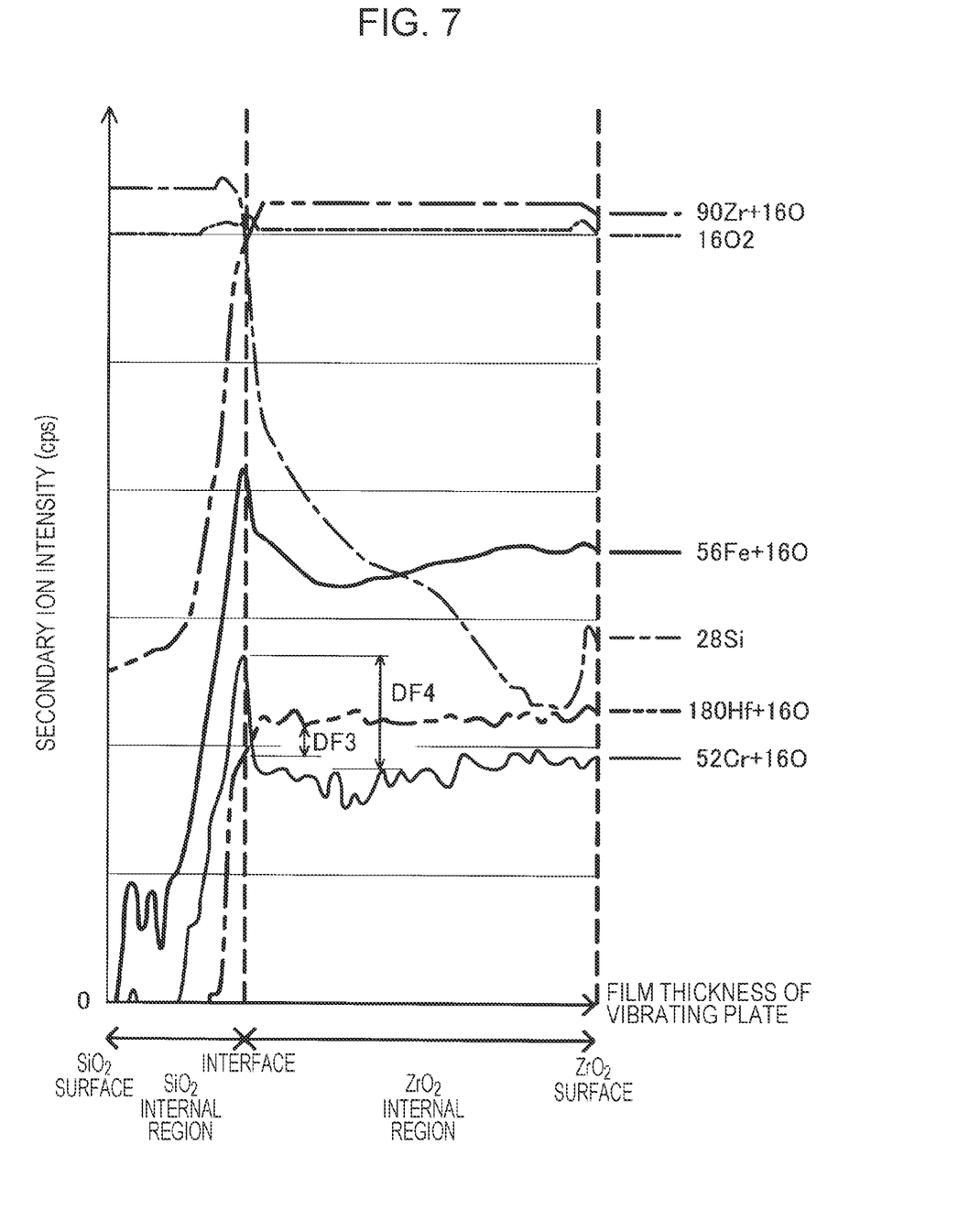
FIG. 7 is an explanatory diagram illustrating examples of concentrations of impurity elements in a vibrating plate containing Hf as a second impurity element.

B. Other Embodiment (B1) In each of the above-described embodiments, the example in which the insulator film 51 contains Ti as the second impurity element is described. On the other hand, the insulator film 51 may contain a second impurity element other than Ti. Regarding the second impurity element contained in the insulator film 51, Hf may be contained in place of Ti or in addition to Ti. Hf may be present as hafnium oxide represented by a composition formula $HfO_2$. FIG. 7 is an explanatory diagram illustrating examples of concentrations of impurity elements in the vibrating plate 50 containing Hf as the second impurity element. As illustrated in FIG. 7, the concentration of Hf in the internal region IA1 is substantially constant. The difference DF3 between the concentration of Hf at the interface IF and the concentration of Hf in the internal region IA1 of the insulator film 51 is smaller than the difference DF4 between the concentration of Cr serving as the first impurity element at the interface IF and the concentration of Cr in the internal region IA1.

C. Other Aspects

The present disclosure is not limited to the above-described embodiments and may be realized in various forms within the bounds of not departing from the scope of the disclosure. For example, the present disclosure may be realized in the following aspects. The technical features in the above-described embodiments corresponding to the technical features in the aspects described below may be appropriately exchanged or combined to address some of or all the problems of the present disclosure or to achieve some of or all the effects of the present disclosure. In this regard, the technical features that are not specified to be indispensable in the specification may be appropriately skipped.

(1) According to an aspect of the present disclosure, a liquid ejecting head is provided. The liquid ejecting head includes a piezoelectric element and a vibrating plate configured to vibrate in response to actuation of the piezoelectric element, the vibrating plate including a first layer that contains $SiO_2$ and a second layer that contains $ZrO_2$ and that is stacked on the first layer. The second layer contains the first impurity element different from Zr and the concentration of the first impurity element at the interface in contact with the first layer in the second layer may be higher than the concentration of the first impurity element in the internal region that is included in the second layer and that is contiguous from the interface to the surface of the second layer. According to the liquid ejecting head of the present aspect, the strength of the vibrating plate can be improved, and a cracking problem of the vibrating plate in response to actuation of the piezoelectric element can be suppressed or prevented.

(2) In the liquid ejecting head according to the above-described aspect, the first impurity element may include a metal element. According to the liquid ejecting head of the present aspect, the strength of the vibrating plate can be further improved.

(3) In the liquid ejecting head according to the above-described aspect, the first impurity element may include Fe. According to the liquid ejecting head of the present aspect, the strength of the vibrating plate can be further improved.

(4) In the liquid ejecting head according to the above-described aspect, the first impurity element may include Cr. According to the liquid ejecting head of the present aspect, the strength of the vibrating plate can be further improved.

(5) In the liquid ejecting head according to the above-described aspect, the first impurity element may include Si. According to the liquid ejecting head of the present aspect, the adhesiveness between the second layer and the first layer can be improved.

(6) In the liquid ejecting head according to the above-described aspect, the internal region may contain the first impurity element. According to the liquid ejecting head of the present aspect, the vibrating plate in which the internal region of the second layer contains the first impurity element can be obtained.

(7) In the liquid ejecting head according to the above-described aspect, the first impurity element contained in the internal region may include Si. At least part of the concentration distribution of Si in the internal region may be a planar region in which the concentration is constant. According to the liquid ejecting head of the present aspect, the vibrating plate in which the internal region has a planar region of the Si concentration can be obtained.

(8) In the liquid ejecting head according to the above-described aspect, the second layer may further contain the second impurity element different from Zr and from the first impurity element. The difference between the concentration of the second impurity element at the interface and the concentration of the second impurity element in the internal region may be smaller than the difference between the concentration of the first impurity element at the interface and the concentration of the first impurity element in the internal region. According to the liquid ejecting head of the present aspect, the vibrating plate in which the internal region of the second layer contains a substantially constant concentration of the second impurity element can be obtained.

(9) In the liquid ejecting head according to the above-described aspect, the concentration of the second impurity element at the interface may be equal to the concentration of the second impurity element in the internal region. According to the liquid ejecting head of the present aspect, the vibrating plate in which the internal region contains a substantially constant concentration of the second impurity element can be obtained.

(10) In the liquid ejecting head according to the above-described aspect, the second impurity element may include a metal element. According to the liquid ejecting head of the present aspect, the vibrating plate in which the internal region contains a substantially constant concentration of metal element as the second impurity element can be obtained.

(11) In the liquid ejecting head according to the above-described aspect, the second impurity element may include Hf. According to the liquid ejecting head of the present aspect, the vibrating plate in which the internal region of the second layer contains Hf can be obtained.

(12) In the liquid ejecting head according to the above-described aspect, the second impurity element may include Ti. According to the liquid ejecting head of the present aspect, the vibrating plate in which the internal region of the second layer contains Ti can be obtained.

(13) In the liquid ejecting head according to the above-described aspect, the concentration of the first impurity element in the first layer may be lower than the concentration of the first impurity element at the interface and lower than the concentration of the first impurity element in the internal region. According to the liquid ejecting head of the present aspect, the concentration of the first impurity element in the first layer can be reduced, and the productivity of the first layer can be improved.

(14) In the liquid ejecting head according to the above-described aspect, the second layer may contain $ZrO_2$ having a columnar crystal structure. According to the liquid ejecting head of the present aspect, the adhesiveness between the second layer and the first layer can be improved, and peeling and the like of the vibrating plate can be suppressed or prevented from occurring.

(15) In the liquid ejecting head according to the above-described aspect, the second layer may contain monoclinic $ZrO_2$. According to the liquid ejecting head of the present aspect, the adhesiveness between the second layer and the first layer can be improved, and peeling and the like of the vibrating plate can be suppressed or prevented from occurring.

(16) In the liquid ejecting head according to the above-described aspect, the interface of the second layer may have compressive stress and the internal region of the second layer may have tensile stress. According to the liquid ejecting head of the present aspect, the interface can be provided with the residual compressive stress, the internal region can be provided with the tensile stress, and the strength of the overall vibrating plate can be improved.

(17) According to another aspect of the present disclosure, a liquid ejecting apparatus is provided. The liquid ejecting apparatus includes the liquid ejecting head according to the above-described aspect and a control portion that controls an ejection operation of the liquid ejecting head. According to the liquid ejecting head of the present aspect, the liquid ejecting apparatus including the liquid ejecting head in which the strength of the vibrating plate is improved can be obtained.

The present disclosure may be realized in various forms other than the liquid ejecting head. The present disclosure may be realized in the forms of, for example, actuators, liquid ejecting apparatuses, printing apparatuses, methods for controlling liquid ejecting apparatuses, methods for controlling liquid ejecting heads, methods for controlling actuators, liquid ejecting methods, computer programs for realizing these methods, and non-temporary recording mediums with the recorded computer programs.

What is claimed is:

1. A liquid ejecting head comprising:
   a piezoelectric element; and
   a vibrating plate configured to vibrate in response to actuation of the piezoelectric element, the vibrating plate including
   a first layer that contains $SiO_2$ and
   a second layer that contains $ZrO_2$ and that is stacked on the first layer, wherein
   the second layer contains a first impurity element different from Zr and
   the concentration of the first impurity element at an interface in contact with the first layer in the second layer is higher than the concentration of the first impurity element in an internal region that is included in the second layer and that is contiguous from the interface to the surface of the second layer,
   wherein the first impurity element includes a metal element, the metal element including Cr.

2. The liquid ejecting head according to claim 1, wherein the internal region contains the first impurity element.

3. The liquid ejecting head according to claim 1, wherein
   the second layer further contains a second impurity element different from Zr and from the first impurity element and
   a difference between the concentration of the second impurity element at the interface and the concentration of the second impurity element in the internal region is smaller than a difference between the concentration of the first impurity element at the interface and the concentration of the first impurity element in the internal region.

4. The liquid ejecting head according to claim 3, wherein the concentration of the second impurity element at the interface is equal to the concentration of the second impurity element in the internal region.

5. The liquid ejecting head according to claim 3, wherein the second impurity element includes a metal element.

6. The liquid ejecting head according to claim 5, wherein the second impurity element includes Ti.

7. The liquid ejecting head according to claim 1, wherein the concentration of the first impurity element in the first layer is lower than the concentration of the first impurity element at the interface and lower than the concentration of the first impurity element in the internal region.

8. The liquid ejecting head according to claim 1, wherein the second layer contains $ZrO_2$ having a columnar crystal structure.

9. The liquid ejecting head according to claim 1, wherein the second layer contains monoclinic $ZrO_2$.

10. The liquid ejecting head according to claim 1, wherein the interface of the second layer has compressive stress and
the internal region of the second layer has tensile stress.

11. A liquid ejecting apparatus comprising:
the liquid ejecting head according to claim 1 and
a control portion that controls an ejection operation of the liquid ejecting head.

12. A liquid ejecting head comprising:
a piezoelectric element; and
a vibrating plate configured to vibrate in response to actuation of the piezoelectric element, the vibrating plate including
a first layer that contains $SiO_2$ and
a second layer that contains $ZrO_2$ and that is stacked on the first layer, wherein
the second layer contains a first impurity element different from Zr and
the concentration of the first impurity element at an interface in contact with the first layer in the second layer is higher than the concentration of the first impurity element in an internal region that is included in the second layer and that is contiguous from the interface to the surface of the second layer,
the second layer further contains a second impurity element different from Zr and from the first impurity element,
a difference between the concentration of the second impurity element at the interface and the concentration of the second impurity element in the internal region is smaller than a difference between the concentration of the first impurity element at the interface and the concentration of the first impurity element in the internal region, and
the second impurity element includes Ti.

13. An actuator comprising:
a piezoelectric element; and
a vibrating plate configured to vibrate in response to actuation of the piezoelectric element, the vibrating plate including
a first layer that contains $SiO_2$ and
a second layer that contains $ZrO_2$ and that is stacked on the first layer, wherein
the second layer contains a first impurity element different from Zr and
the concentration of the first impurity element at an interface in contact with the first layer in the second layer is higher than the concentration of the first impurity element in an internal region that is included in the second layer and that is contiguous from the interface to the surface of the second layer,
wherein the first impurity element includes a metal element, the metal element including Cr.

* * * * *